United States Patent
Kang et al.

(10) Patent No.: US 12,451,412 B2
(45) Date of Patent: Oct. 21, 2025

(54) BACKSIDE GATE VIA STRUCTURE USING SELF-ALIGNED SCHEME

(71) Applicant: INTERNATIONAL BUSINESS MACHINES CORPORATION, Armonk, NY (US)

(72) Inventors: Tsung-Sheng Kang, Ballston Lake, NY (US); Tao Li, Slingerlands, NY (US); Ruilong Xie, Niskayuna, NY (US); Leon Sigal, Monsey, NY (US)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 18/177,171

(22) Filed: Mar. 2, 2023

(65) Prior Publication Data
US 2024/0297098 A1    Sep. 5, 2024

(51) Int. Cl.
| | |
|---|---|
| *H01L 23/48* | (2006.01) |
| *H01L 29/06* | (2006.01) |
| *H01L 29/775* | (2006.01) |
| *H01L 29/786* | (2006.01) |
| *H10D 30/43* | (2025.01) |
| *H10D 30/67* | (2025.01) |
| *H10D 62/10* | (2025.01) |

(52) U.S. Cl.
CPC ......... *H01L 23/481* (2013.01); *H10D 30/43* (2025.01); *H10D 30/6757* (2025.01); *H10D 62/121* (2025.01)

(58) Field of Classification Search
CPC .............. H01L 23/481; H01L 23/5286; H01L 21/76897; H10D 30/43; H10D 30/6757; H10D 62/121; H10D 30/014; H10D 30/6735
USPC ......................................................... 257/737
See application file for complete search history.

(56) References Cited

U.S. PATENT DOCUMENTS

| | | | |
|---|---|---|---|
| 10,636,739 B2 | 4/2020 | Beyne | |
| 10,797,139 B2 | 10/2020 | Morrow | |
| 11,355,601 B2 | 6/2022 | Chiang | |
| 2021/0111115 A1 | 4/2021 | Morrow | |
| 2021/0134721 A1 | 5/2021 | Chiang | |
| 2021/0202385 A1 | 7/2021 | Huang | |
| 2021/0375761 A1* | 12/2021 | Chang | ............... H10D 84/0167 |
| 2021/0376093 A1 | 12/2021 | Chu | |
| 2022/0093594 A1* | 3/2022 | Song | ..................... H10D 84/85 |
| 2022/0130759 A1 | 4/2022 | Huang | |

* cited by examiner

*Primary Examiner* — Tong-Ho Kim
(74) *Attorney, Agent, or Firm* — Samuel A. Waldbaum

(57) ABSTRACT

A structure including a plurality of nanosheet transistors each comprising a gate. A gate protrusion extends from the gate towards the backside of one of the plurality of electronic devices. A first dielectric liner is located flush against the sidewalls of the gate protrusion. A contact via connected to a backside surface of the gate protrusion. A second dielectric liner located flush again the sidewalls of the contact via.

20 Claims, 15 Drawing Sheets

TOP DOWN VIEW

CROSS-SECTION X2

CROSS-SECTION X1

CROSS-SECTION Y1

CROSS-SECTION Y2

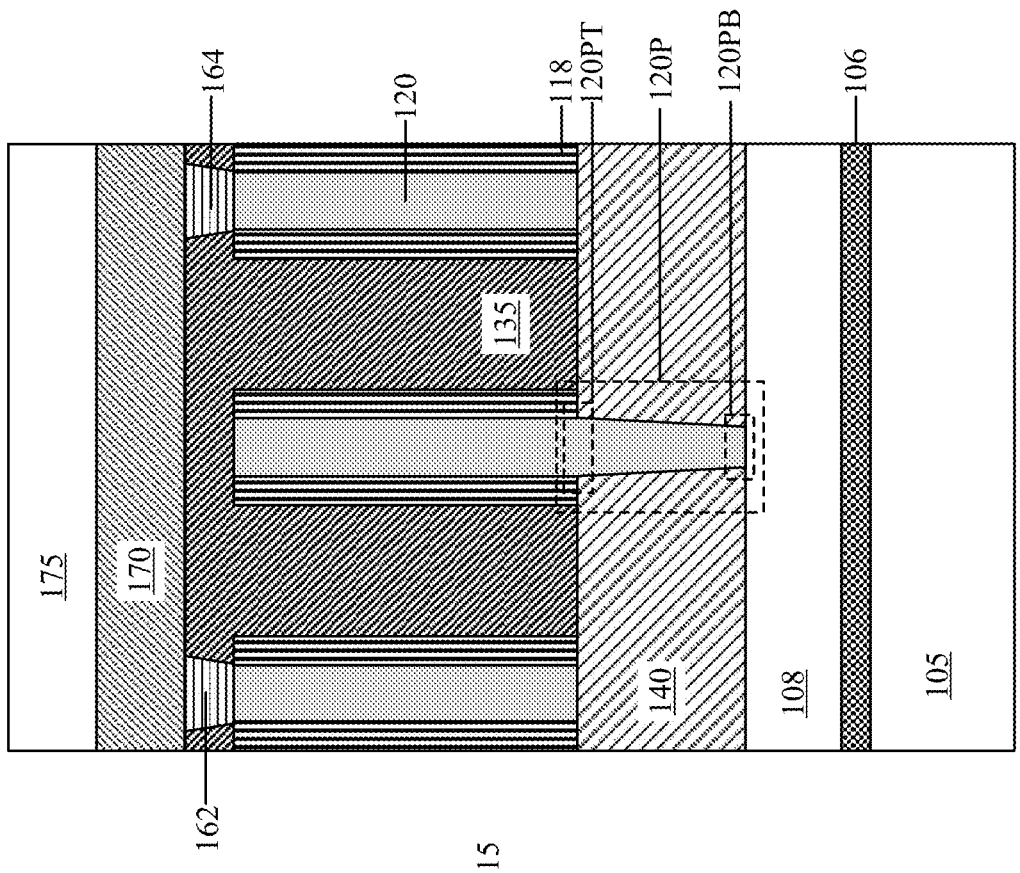
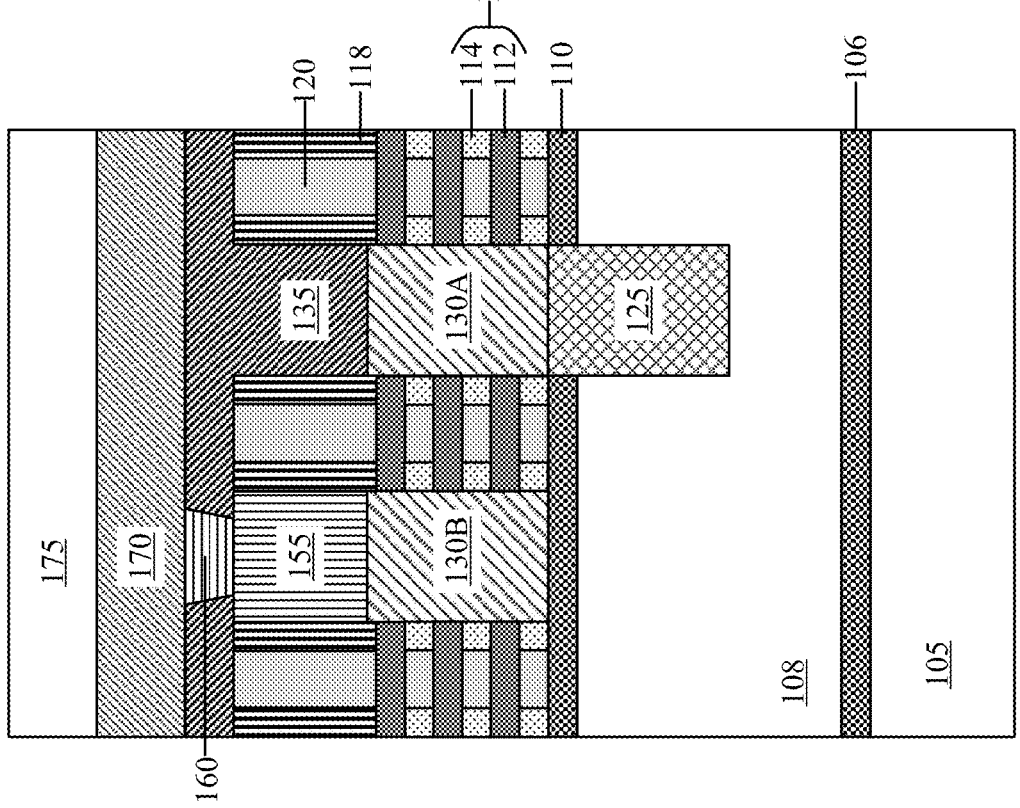

CROSS-SECTION Y2

CROSS-SECTION Y1

CROSS- SECTION X1

CROSS- SECTION X2

CROSS-SECTION Y1

CROSS-SECTION Y2

CROSS- SECTION X1

CROSS- SECTION X2

CROSS-SECTION Y1

CROSS-SECTION Y2

CROSS-SECTION X1

CROSS-SECTION X2

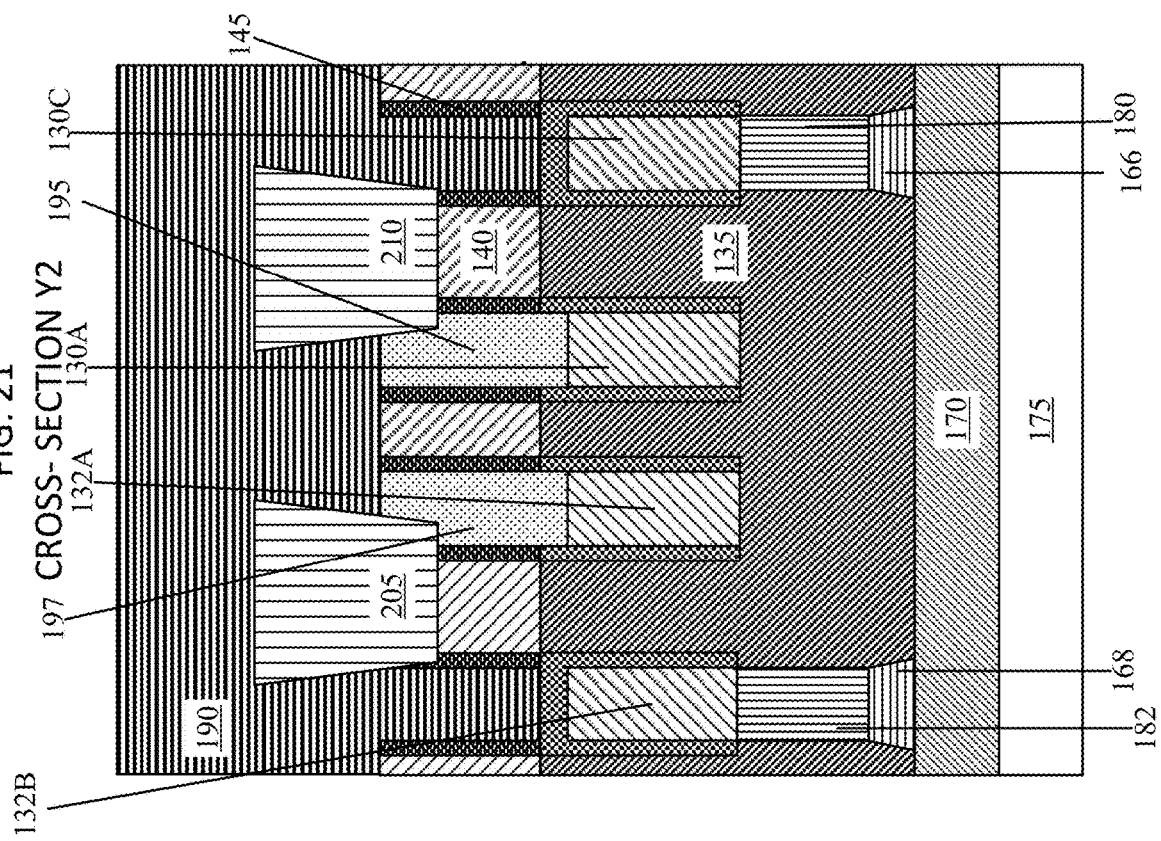
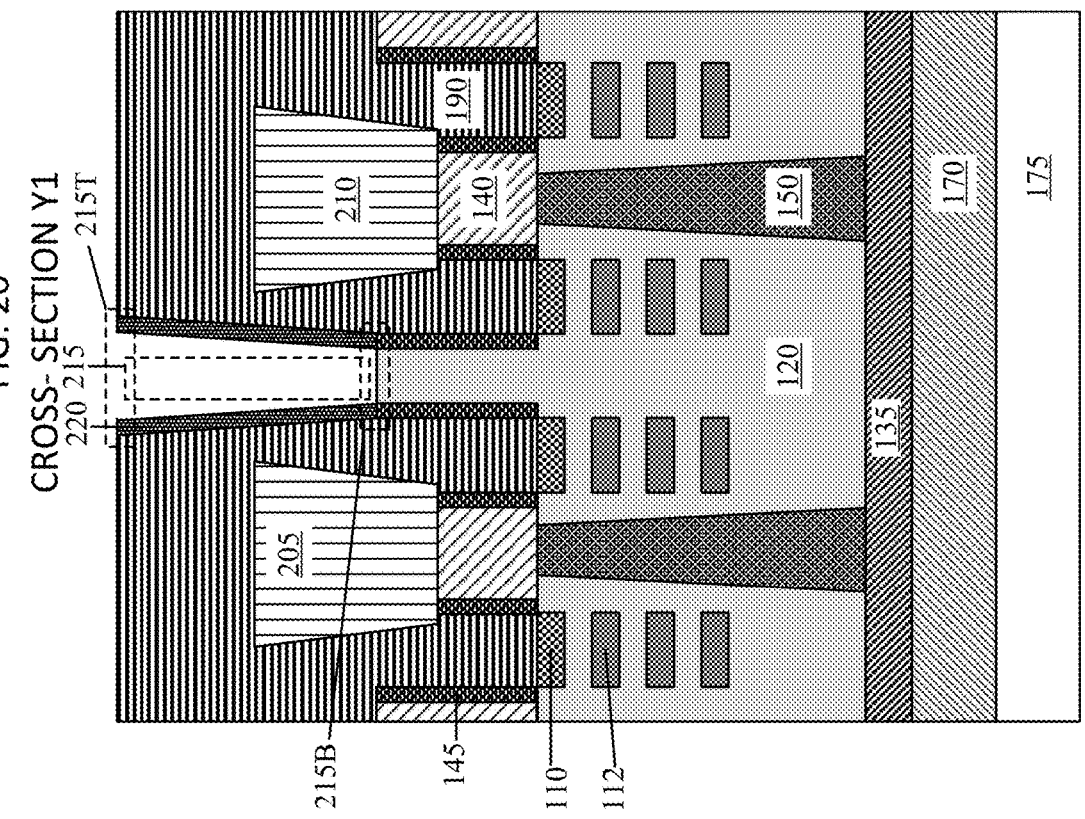

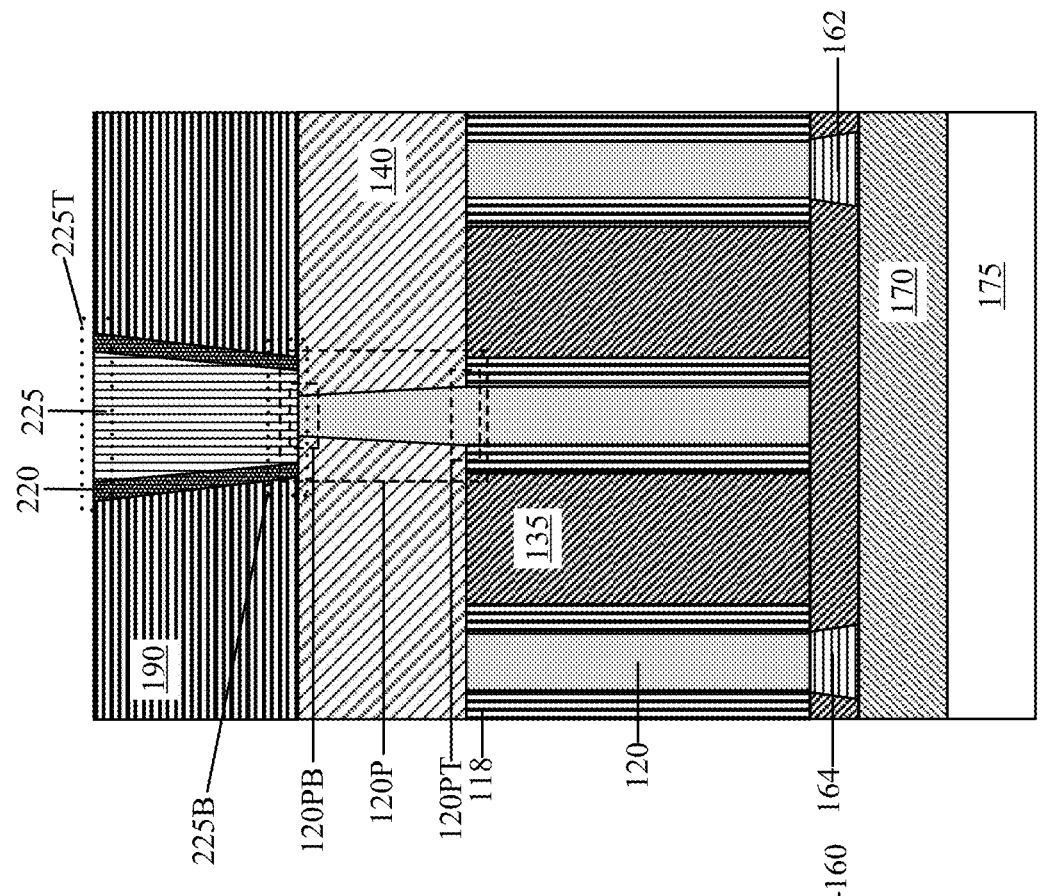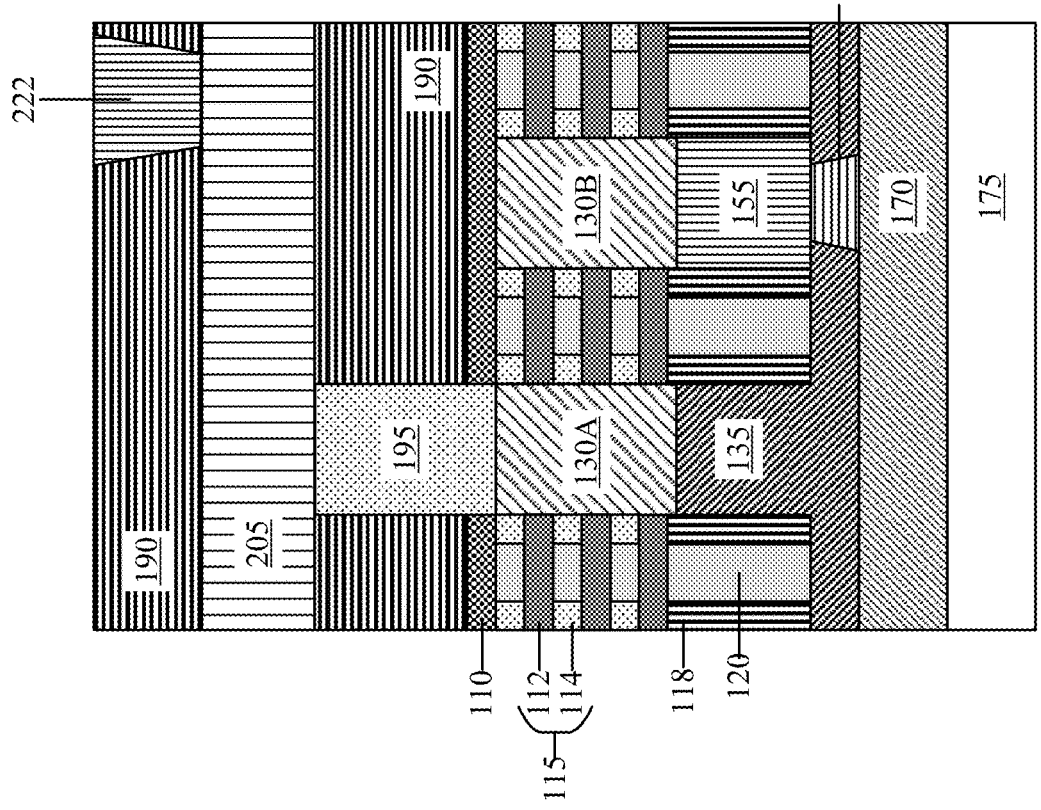

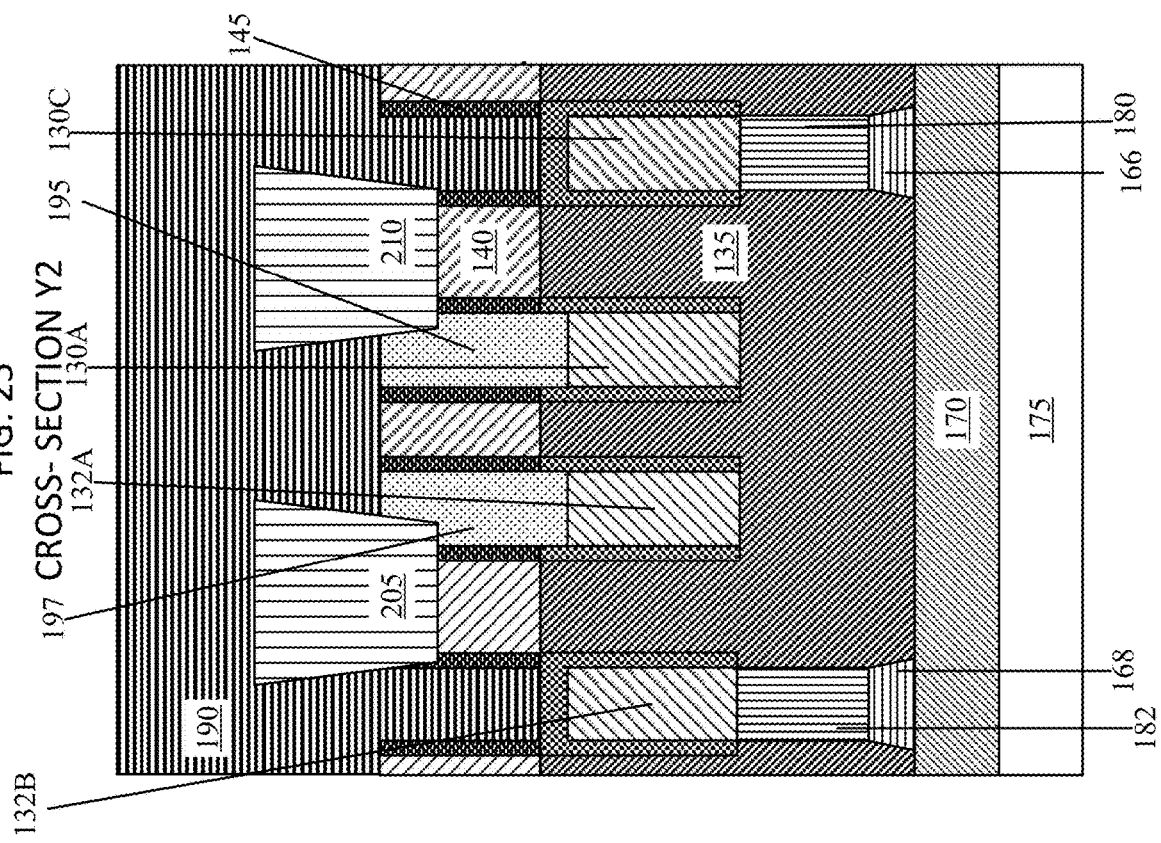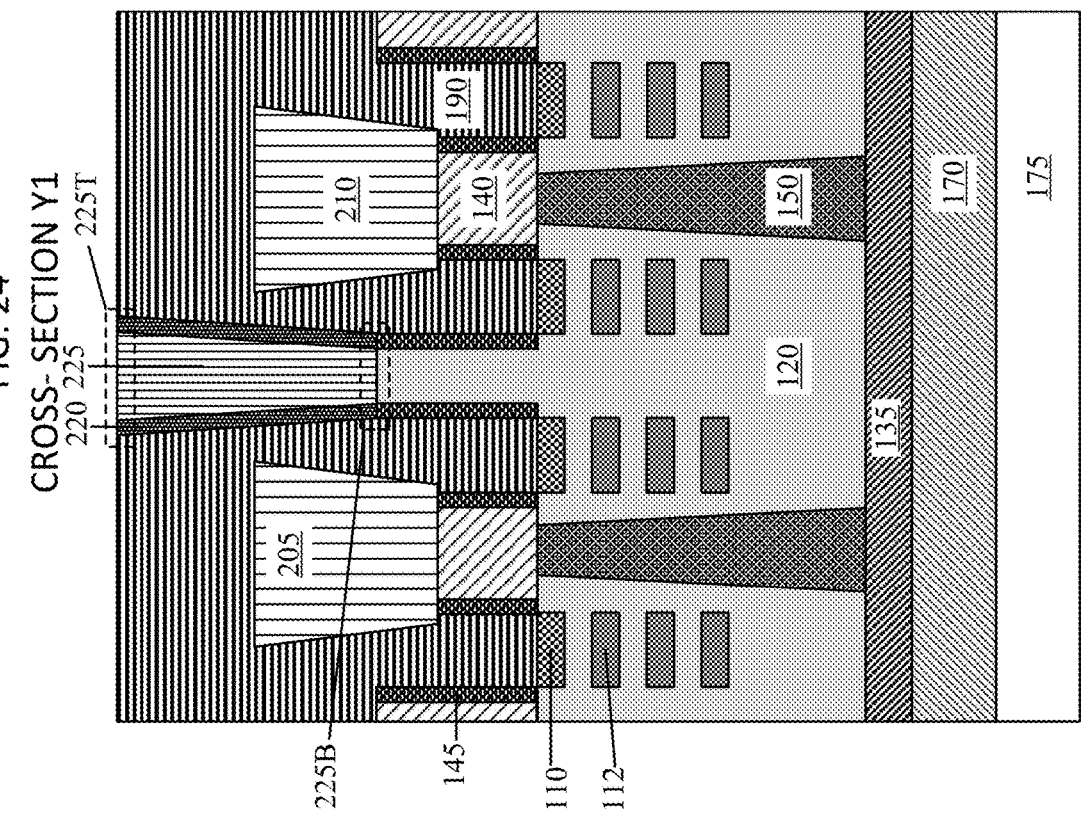

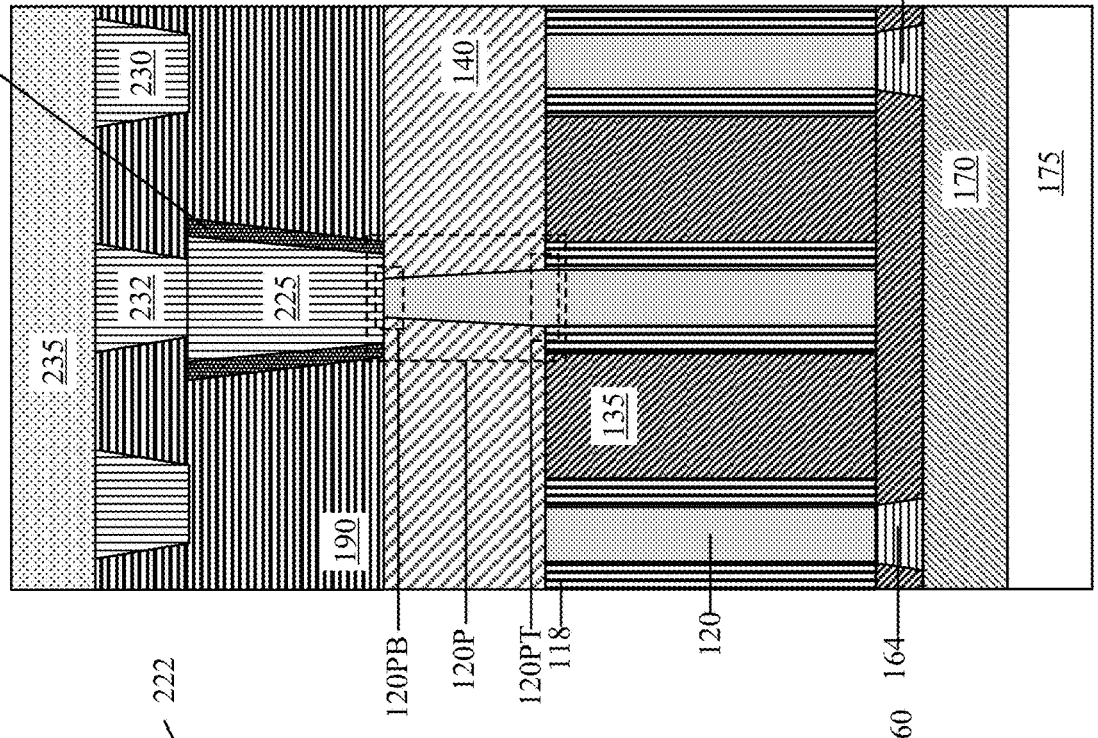
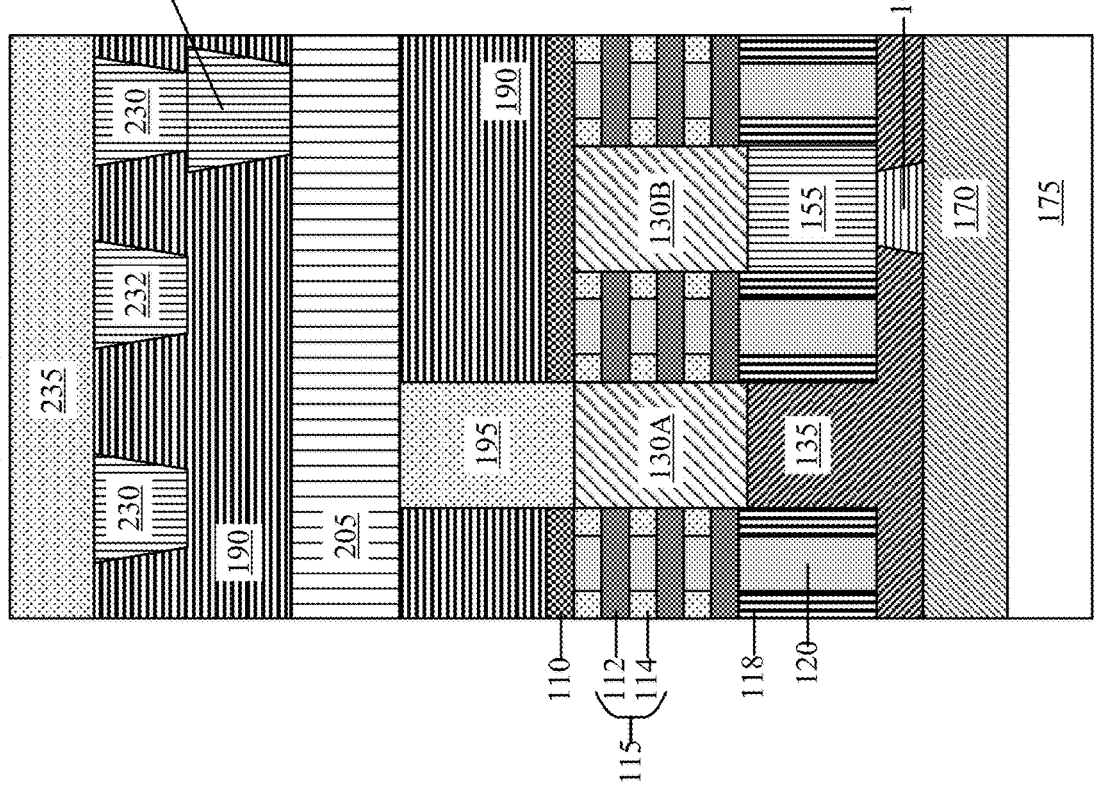

FIG. 28
CROSS-SECTION Y1

FIG. 29
CROSS-SECTION Y2

BACKSIDE GATE VIA STRUCTURE USING SELF-ALIGNED SCHEME

BACKGROUND

The present invention generally relates to the field of microelectronics, and more particularly to formation of a backside gate via structure.

Nanosheet is the lead device architecture in continuing CMOS scaling. However, nanosheet technology has shown issues when scaling down such that as the devices become smaller and closer together, they are interfering with each other. With the number of devices being fit in a smaller area it is becoming harder to form a backside gate contact.

BRIEF SUMMARY

Additional aspects and/or advantages will be set forth in part in the description which follows and, in part, will be apparent from the description, or may be learned by practice of the invention.

A structure including a plurality of nanosheet transistors each comprising a gate. A gate protrusion extends from the gate towards the backside of one of the plurality of electronic devices. A first dielectric liner is located flush against the sidewalls of the gate protrusion. A contact via connected to a backside surface of the gate protrusion. A second dielectric liner located flush again the sidewalls of the contact via.

A structure including a plurality of nanosheet transistors each comprising a gate. A gate protrusion extends from the gate towards the backside of one of the plurality of nanosheet transistors. A first dielectric liner is located flush against the sidewalls of the gate protrusion. A contact via connected to a backside surface of the gate protrusion, a second dielectric liner located flush again the sidewalls of the contact via. A shallow trench isolation layer located beneath the gates of the plurality of the electronic devices. The shallow trench isolation layer is flush against the sidewalls of the gate protrusion from the perspective a first cross-section horizontally across the plurality of electronic devices. The first dielectric liner is flush against the sidewalls of the gate protrusion from a perspective a second cross-section, and the second cross-section is perpendicular to the first cross-section. The second dielectric liner is connected to the first dielectric liner from the perspective of the second cross-section. The second dielectric liner and the first dielectric liner form a continuous liner along the sidewalls of the gate protrusion and the contact via from the perspective of the second cross-section.

A structure including a plurality of nanosheet transistors each comprising a gate. A gate protrusion extends from the gate towards the backside of one of the plurality of nanosheet transistors. A first dielectric liner is located flush against the sidewalls of the gate protrusion. A contact via connected to a backside surface of the gate protrusion. A second dielectric liner located flush again the sidewalls of the contact via. A first backside metal line and a second backside metal line, where the gate protrusion and the contact via are located between the first backside metal line and the second backside metal line. The first dielectric liner and the second dielectric liner form a barrier between the gate protrusion and the first backside metal line and the second backside metal line. The first dielectric liner and the second dielectric liner form a barrier between the contact via and the first backside metal line and the second backside metal line.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 6 illustrates a cross section X1 of the nano stack after the formation of the frontside contacts, the backend of the line layers, and the carrier wafer, in accordance with the embodiment of the present invention.

FIG. 7 illustrates a cross section X2 of the nano stack after the formation of the frontside contacts, the backend of the line layers, and the carrier wafer, in accordance with the embodiment of the present invention.

FIG. 20 illustrates a cross section Y1 of the source/drain region after formation of additional backside interlayer dielectric layer and the formation of a plurality of trenches, in accordance with the embodiment of the present invention.

FIG. 21 illustrates a cross section Y2 of the source/drain region after formation of additional backside interlayer dielectric layer and the formation of a plurality of trenches, in accordance with the embodiment of the present invention.

FIG. 22 illustrates a cross section X1 of the nano stack after formation of conductive vias, in accordance with the embodiment of the present invention.

FIG. 23 illustrates a cross section X2 of the nano stack after formation of conductive vias, in accordance with the embodiment of the present invention.

FIG. 24 illustrates a cross section Y1 of the source/drain region after formation of conductive vias, in accordance with the embodiment of the present invention.

FIG. 25 illustrates a cross section Y2 of the source/drain region after formation of conductive vias, in accordance with the embodiment of the present invention.

FIG. 26 illustrates a cross section X1 of the nano stack after formation of additional metal lines, signal lines, and a backside-power-distribution-network, in accordance with the embodiment of the present invention.

FIG. 27 illustrates a cross section X2 of the nano stack after formation of additional metal lines, signal lines, and a backside-power-distribution-network, in accordance with the embodiment of the present invention.

FIG. 28 illustrates a cross section Y1 of the source/drain region after formation of additional metal lines, signal lines, and a backside-power-distribution-network, in accordance with the embodiment of the present invention.

FIG. 29 illustrates a cross section Y2 of the source/drain region after formation of additional metal lines, signal lines, and a backside-power-distribution-network, in accordance with the embodiment of the present invention.

DETAILED DESCRIPTION

Figure 1:
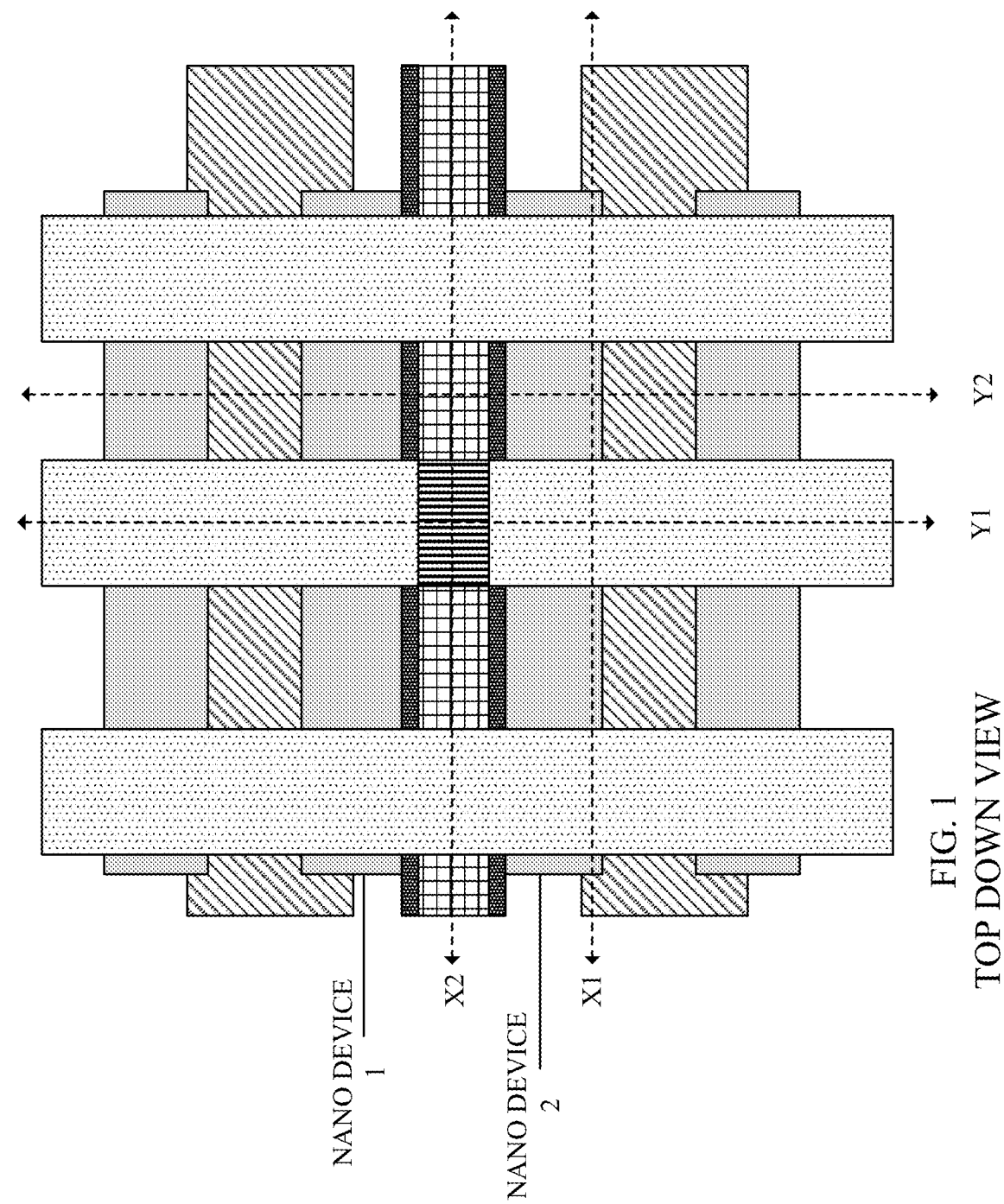
FIG. 1 illustrates a top-down view of multiple nano devices, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art of affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. When a wafer backside clock signal line is located at N/P FET boundary and there is a nearby backside Vss/Vdd, then there is a risk of direct backside source/drain (S/D) contact short. The short is formed between the gate backside via and the contacts. The present invention is directed towards forming a self-aligned gate contact via and clock signal with respect to the Vdd/Vss.

FIG. 1 illustrates a top-down view of multiple nano devices which can be comprised of electronic components such as transistors, in accordance with the embodiment of the present invention. The cross-section X1 extends horizontally through the nano stacks 115 of one of the devices. The cross-section X2 extends horizontally through a gate cut region. Cross section Y1 is perpendicular to cross section X1 and X2, where cross section Y1 is through a gate region that spans across multiple nano stacks. Cross section Y2 is perpendicular to cross section X, where cross section Y2 is through a source/drain region that spans across multiple nano stacks.

Referring now to FIGS. 2, 3, 4 and 5, a structure is shown during an intermediate step of a method of fabricating nano devices, such as, a nanosheet transistor structure according to an embodiment of the invention.

Figure 2:
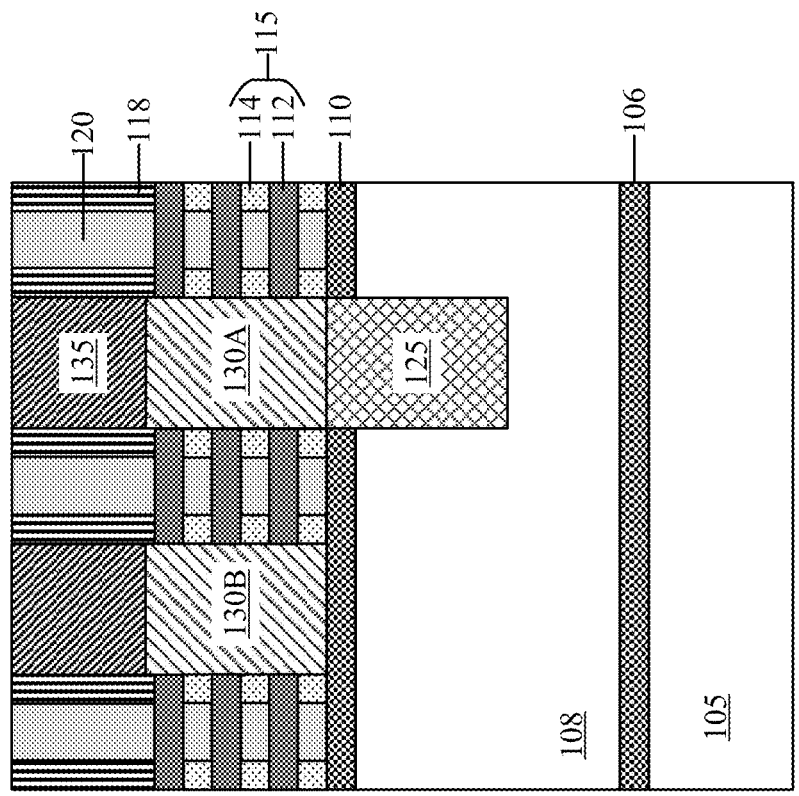
FIG. 2 illustrates a cross section X1 of the nano stack after the formation of the gate, the source/drains, in accordance with the embodiment of the present invention.

FIGS. 2, 3, 4, and 5 illustrate the processing stage of the structure after the formation of the gate, the first source/drain 130A and the second source drain 130B. FIG. 2 illustrates a first substrate 105, an etch stop 106, a second substrate 108, a bottom dielectric layer 110, a plurality of nano stacks 115, a gate 120, an upper spacer 118, a first source/drain 135A, a second source/drain 135B, a first backside placeholder 125, a frontside interlayer dielectric layer 135.

The first substrate 105 and the second substrate 108 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the first substrate 105 and the second substrate 108. In some embodiments, first substrate 105 and the second substrate 108 includes both semiconductor materials and dielectric materials. The semiconductor first substrate 105 and the second substrate 108 may also comprise an organic semiconductor or a layered semiconductor such as, for example, Si/SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein.

The nano stacks 115 includes a plurality of channel layers 112 (e.g., Si nano sheets). The nano stacks 115 are located on top of the bottom dielectric isolation layer 110. The channel layers 112, or nano sheets, are spaced apart from each other, such that an inner spacer 114 is located between the channel layers 112. The gate 120 is wrapped around each of the channel layers 112. The gate 120 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. The gate 120 is located on top of the top channel layer 112, where the gate 120 is located between two different upper spacer 118 segments.

The first source/drain 130A and the second source/drain 130B are located between nano stack columns as illustrated by FIG. 2. A first backside placeholder 125 is located beneath the first source/drain 130A. The frontside interlayer dielectric layer 135 is located on top of the first source/drain 130A and the second source/drain 130B. The first backside placeholder 125 extends through the bottom dielectric isolation layer 110, such that the first backside placeholder 125 is in contact with a backside surface of the first source/drain 130A. The first backside placeholder 125 extends downwards into the second substrate 108.

Figure 3:
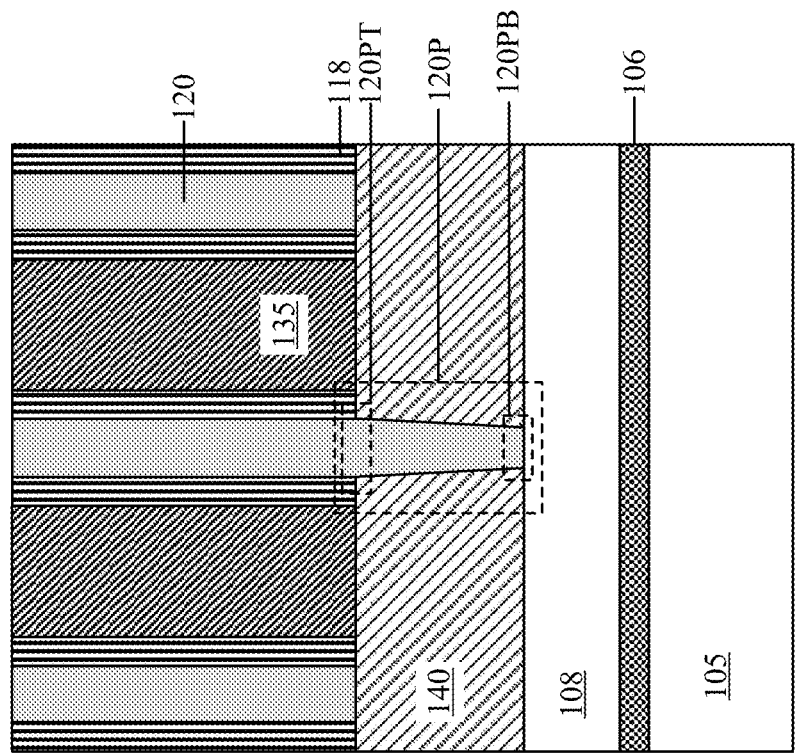
FIG. 3 illustrates a cross section X2 of the nano stack after the formation of the gate, the source/drains, in accordance with the embodiment of the present invention.

FIG. 3 illustrates cross-section X2 which illustrates a horizontal cross section of multiple gates 120 that are located above the shallow trench isolation layer 140. Cross section X2 illustrates the location between the nano device 1 and nano device 2 as shown in FIG. 1. One of the gates 120 includes a gate protrusion 120P that extends through the shallow trench isolation layer 140. The gate protrusion 120P has a top section 120PT and a bottom section 120PB. The top section 120PT has a width that is greater than the bottom section 120PB of the gate protrusion 120P as illustrated in FIG. 3. The gate protrusion 120P can extend into the second substrate 108 or be in contact with a top surface of the second substrate 108.

Figure 4:
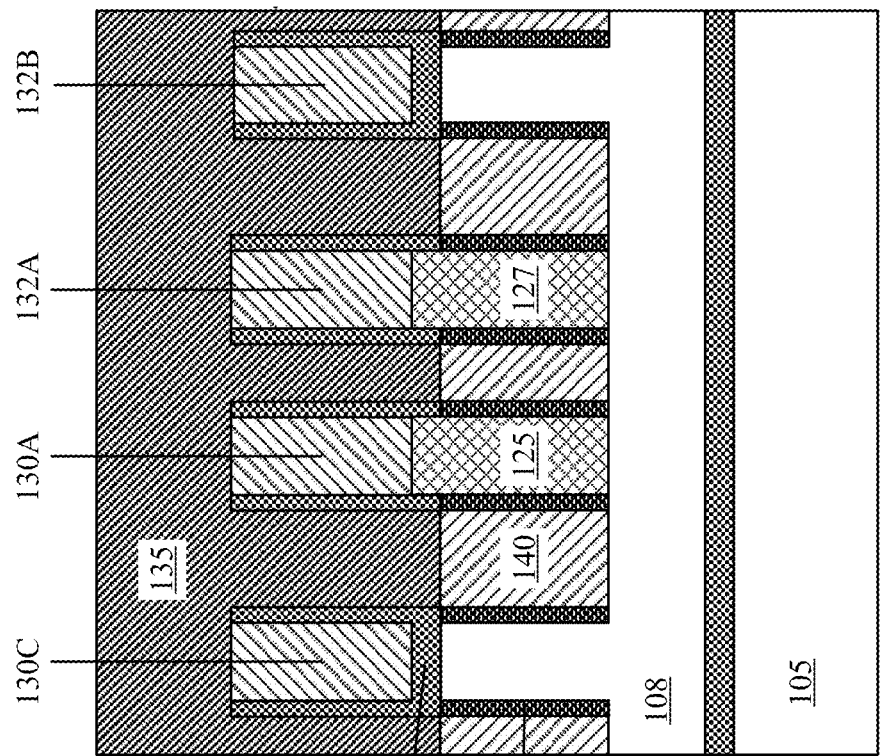
FIG. 4 illustrates a cross section Y1 of the source/drain region after the formation of the gate, the source/drains, in accordance with the embodiment of the present invention.

FIG. 4 illustrates the gate region which shows the gate protrusion 120P from a different perspective than the perspective that is shown in FIG. 3. Gate cuts 150 separate the gate 120 into a plurality of different regions. From the perspective shown in FIG. 4, the bottom section 120PB and the top section 120PT of the gate protrusion 120P has substantially the same width. A dielectric liner 145 extends along the sidewalls of the trenches in the second substrate 108 where the shallow trench isolation layer 140 is located. The dielectric liner 145 is located on the sidewalls of the gate protrusion 120P, meaning that the dielectric liner 145 is flush against the sidewalls of the gate protrusion 120P. The dielectric liner 145 is located between the second substrate 108 and the gate protrusion 120P. The dielectric liner 145 can be comprised of, for example, SiN, SiBCN, SiOCN, SiC, SiOC, etc.

Figure 5:
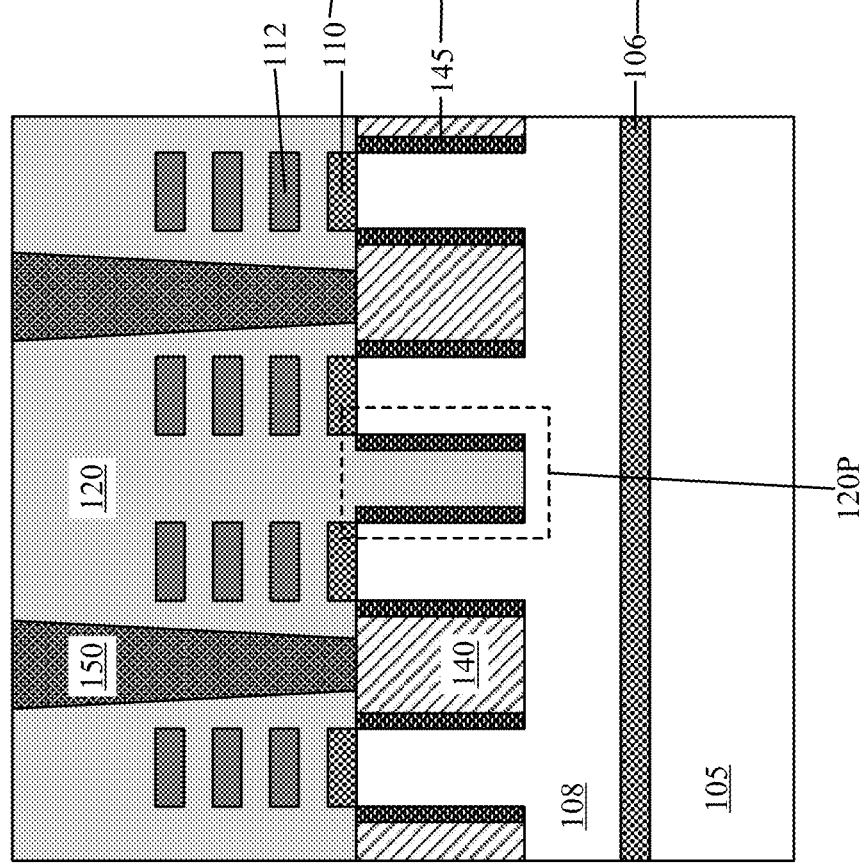
FIG. 5 illustrates a cross section Y2 of the source/drain region after the formation of the gate, the source/drains, in accordance with the embodiment of the present invention.

FIG. 5 illustrates cross section Y2 showing a source/drain region that includes the first source/drain 130A, a third source/drain 130C, a fourth source/drain 132A, and a fifth source/drain 132B. The first source/drain 130A, the second source/drain 130B and the third source/drain 130C are a first type of source/drain. The fourth source/drain 132A and the fifth source/drain 132B are a second type of source/drain, where the first type of source/drain is different than the second type of source/drain. A second backside placeholder 127 is located beneath the fourth source/drain 132A.

The first source/drain 130A, the second source/drain 130B, the third source/drain 130C, the fourth source/drain 132A, and the fifth source/drain 132B can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIGS. 6, 7, 8, and 9 illustrate the processing stage after the formation of the frontside contacts 160, 162, 164, 166, 168 the backend of the line layers 170, and the carrier wafer 175. A portion of the frontside interlayer dielectric layer 135 located above the second source/drain 130B is removed create a trench (not shown). The trench is filled in with a conductive material to form a first contact shaft 155. Additional frontside interlayer layer 135 material is formed on top of the exposed layers. A trench (not shown) is formed in the frontside interlayer dielectric layer 135 above the first contact shaft 155, where the trench exposes a top surface of the first contact shaft 155. The trench is filled in with a conductive material to form a first frontside contact 160. Backend-of-the-line (BEOL) layer 170 is formed on top of the frontside interlayer dielectric layer 135 and on top of the first frontside contact 160. A carrier wafer 175 is formed on top of the BEOL layer 170.

Figure 9:
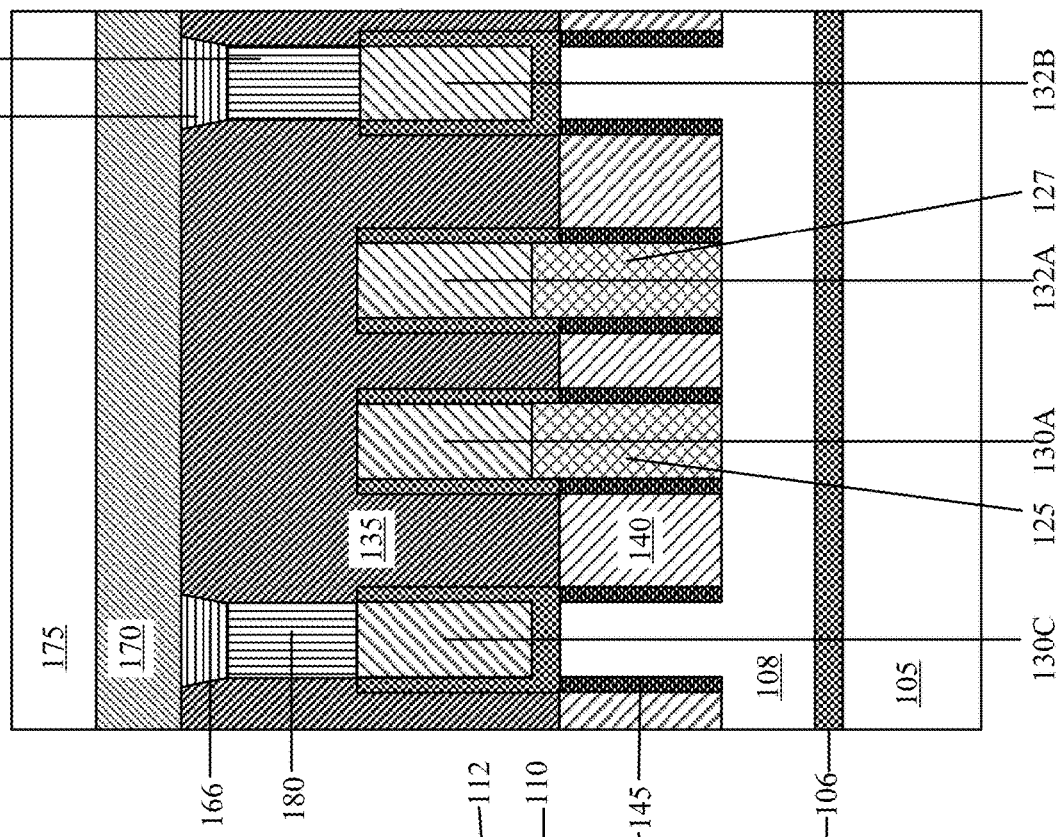
FIG. 9 illustrates a cross section Y2 of the source/drain region after the formation of the frontside contacts, the backend of the line layers, and the carrier wafer, in accordance with the embodiment of the present invention.
Figure 8:
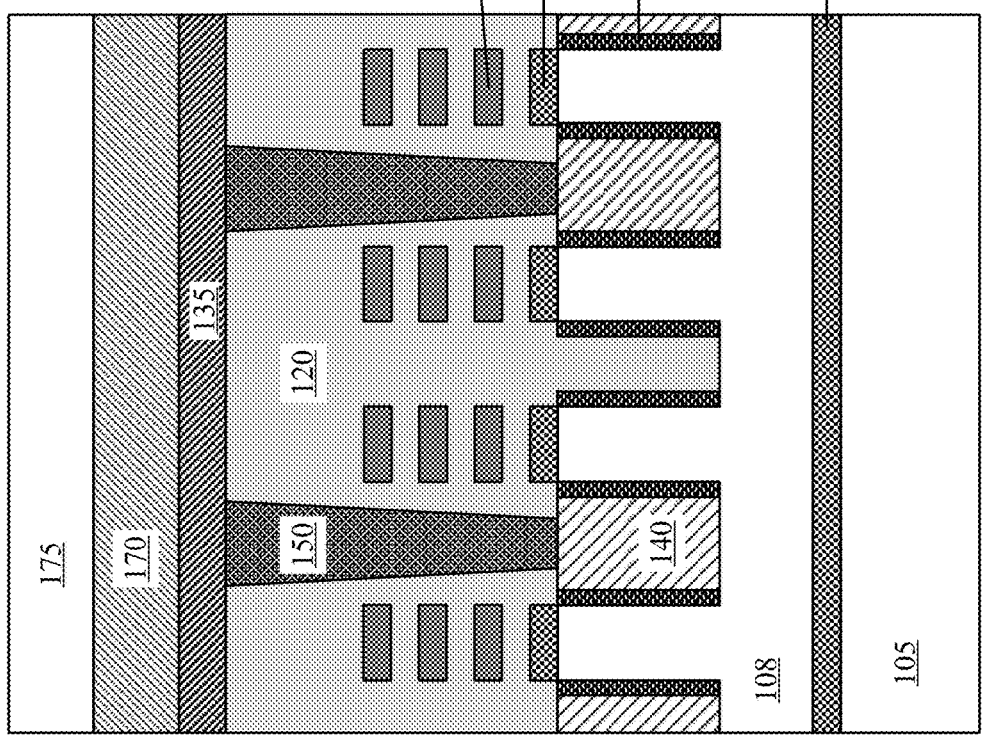
FIG. 8 illustrates a cross section Y1 of the source/drain region after the formation of the frontside contacts, the backend of the line layers, and the carrier wafer, in accordance with the embodiment of the present invention.
Figure 10:
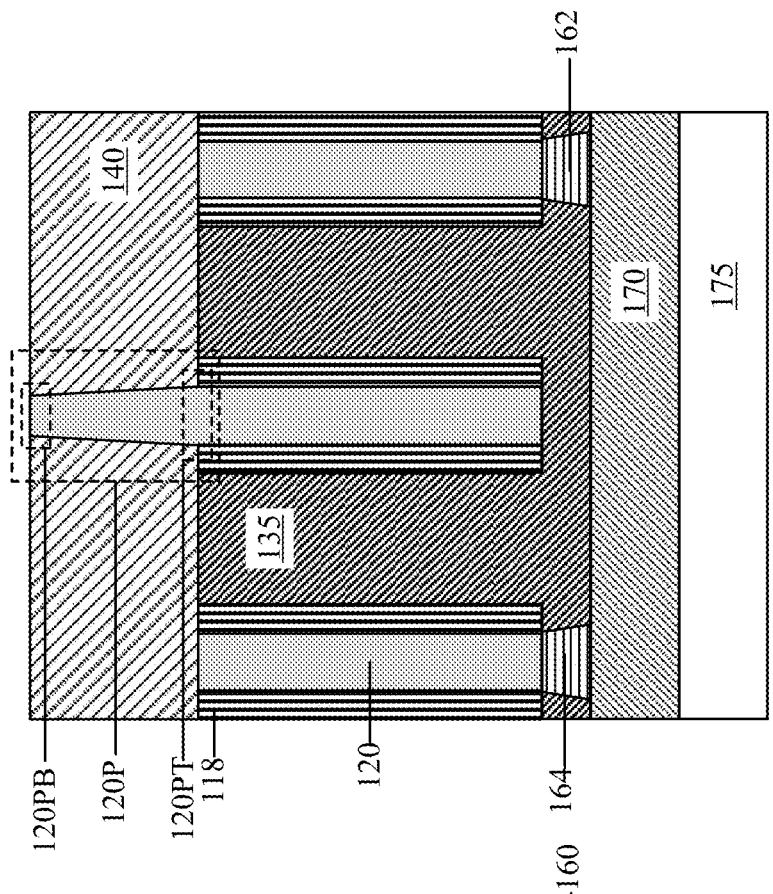
FIG. 10 illustrates a cross section X1 of the nano stack after flipping over the chip for backside processing, in accordance with the embodiment of the present invention.

FIG. 7 illustrates the formation of a second frontside contact 162 and a third frontside contact 164. A first trench (not shown) and a second trench (not shown) are formed in the frontside interlayer dielectric layer 135. The first trench and the second trench expose a top surface of different gates 120. The first trench and the second trench are filled in with a conductive material to form the second frontside contact 162 and the third frontside contact 164. FIG. 9 illustrates a third and fourth trench (not shown) were formed in the frontside interlayer dielectric layer 135, where the third trench exposes a top surface of the third source/drain 130C and the fourth trench exposes a top surface of the fifth source/drain 132B. The third trench and the fourth trench are filled in with a conductive metal to form a second contact shaft 180 and a third contact shaft 182. Additional frontside interlayer dielectric layer 135 is formed on top of the second contact shaft 180 and the third contact shaft 182. A sixth trench (not shown) is formed in the frontside interlayer dielectric layer 135 located on top of the second contact shaft 180 and a seventh trench (not shown) is formed in the frontside interlayer dielectric layer 135 located on top of the third contact shaft 182. The sixth and seventh trench are filled in with a conductive metal to form a fourth frontside contact 166 and a fifth frontside contact 168.

Figure 11:
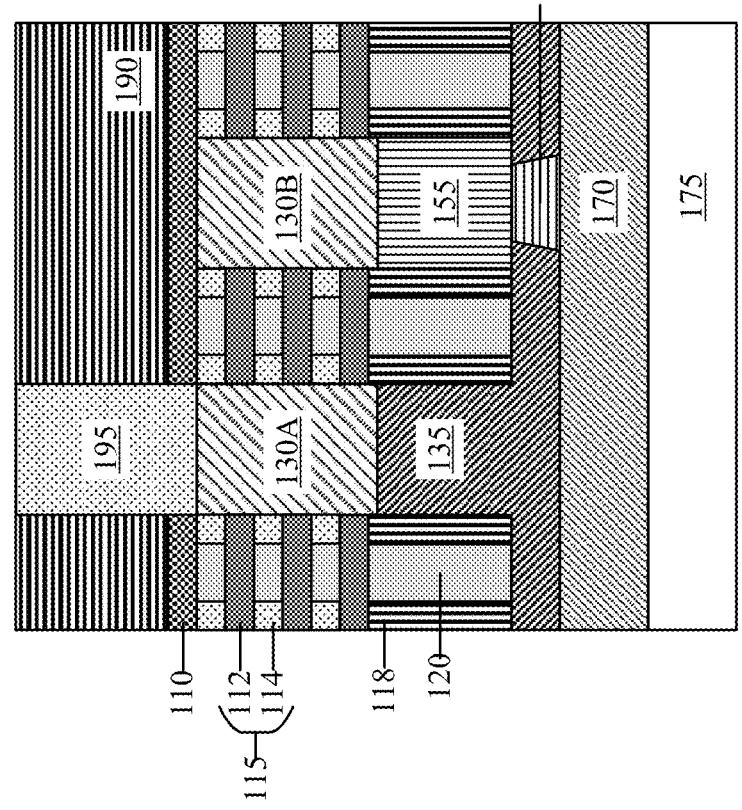
FIG. 11 illustrates a cross section X2 of the nano stack after flipping over the chip for backside processing, in accordance with the embodiment of the present invention.
Figure 12:
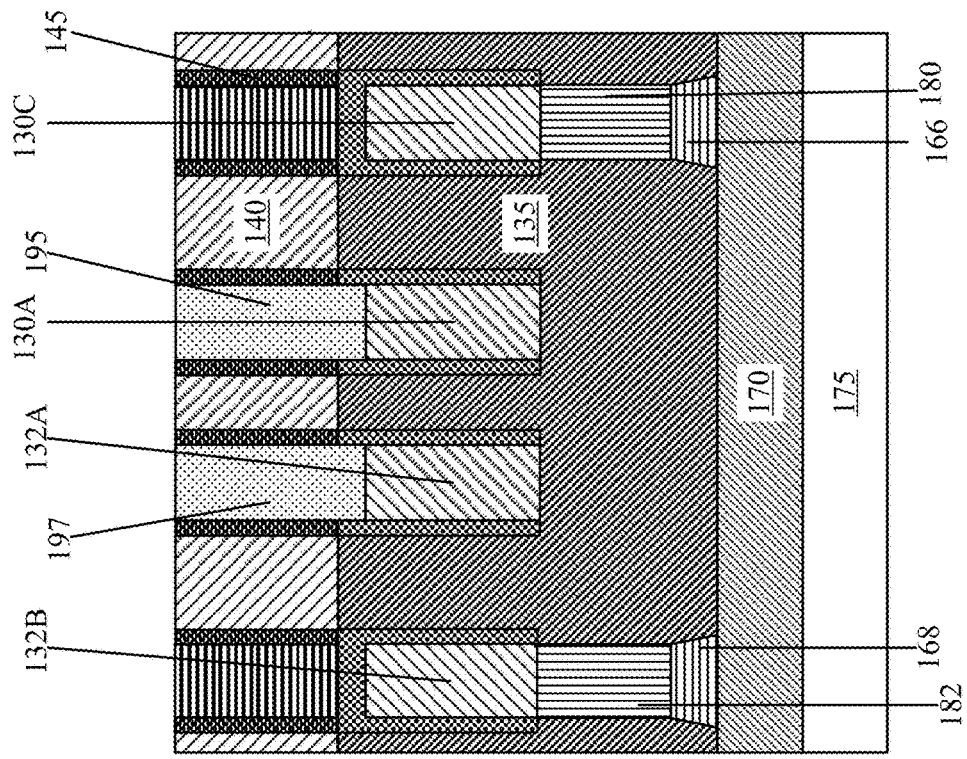
FIG. 12 illustrates a cross section Y1 of the source/drain region after flipping over the chip for backside processing, in accordance with the embodiment of the present invention.
Figure 13:
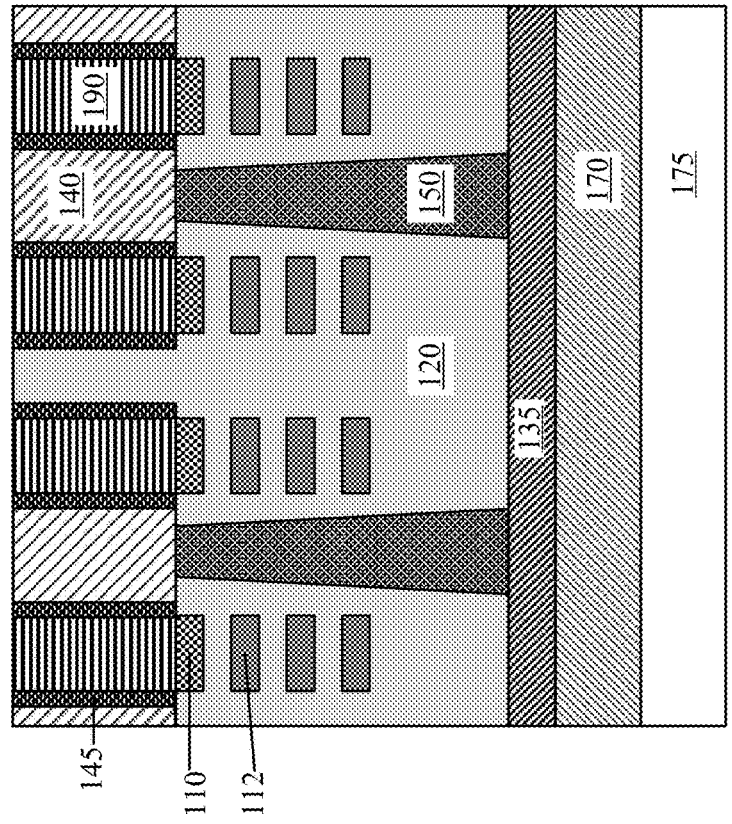
FIG. 13 illustrates a cross section Y2 of the source/drain region after flipping over the chip for backside processing, in accordance with the embodiment of the present invention.

FIGS. 10, 11, 12, and 13 illustrate the processing stage after flipping over the chip for backside processing. The devices are flipped over for backside processing. The first substrate 105, the etch stop 106, and the second substrate 108 are removed. A backside interlayer dielectric layer 190 is formed around the first backside placeholder 125. The first backside placeholder 125 is removed to expose a trench located above the backside surface of the first source/drain 130A. The trench is filled in with a conductive metal to form a first backside contact shaft 195. FIGS. 11 and 12 illustrates how the removal of the first substrate 105, the etch stop 106, and the second substrate 108 exposes the backside surface of the gate protrusion 120P. FIG. 13 illustrates the formation of the first backside contact shaft 195 and a second backside contact shaft 197. The first backside placeholder 125 and the second backside placeholder 127 are removed to form a plurality of trenches/cavities. The trenches/cavities are filled in with a conductive metal to form the first backside contact shaft 195 and the second backside contact shaft 197.

Figure 14:
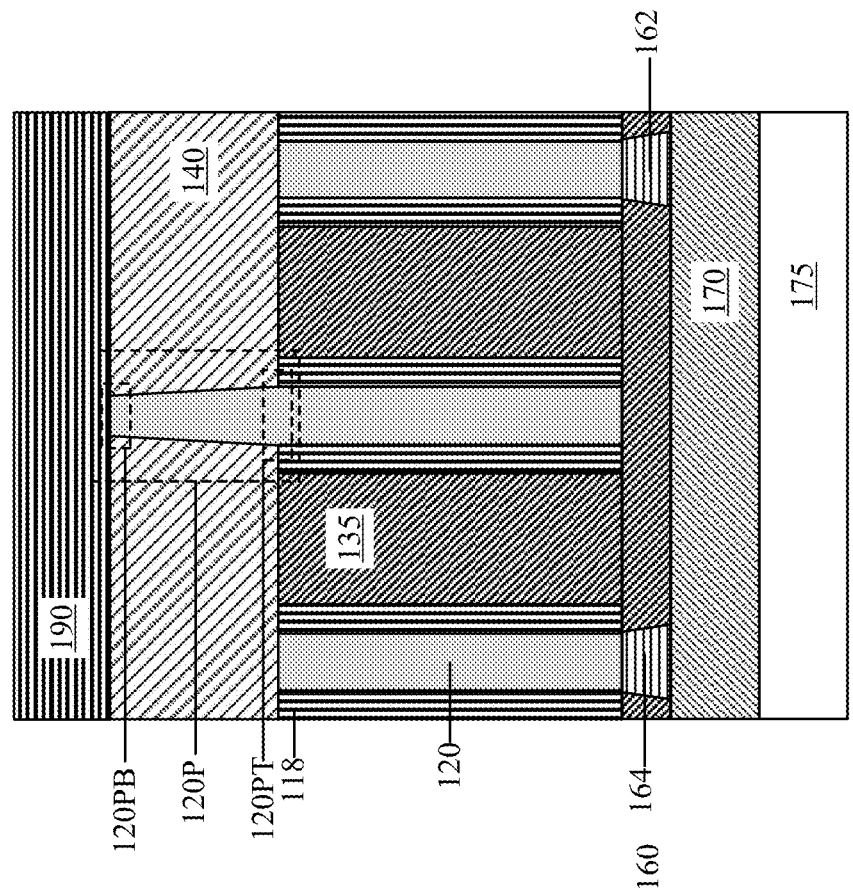
FIG. 14 illustrates a cross section X1 of the nano stack after formation of a plurality of backside metal lines, in accordance with the embodiment of the present invention.
Figure 15:
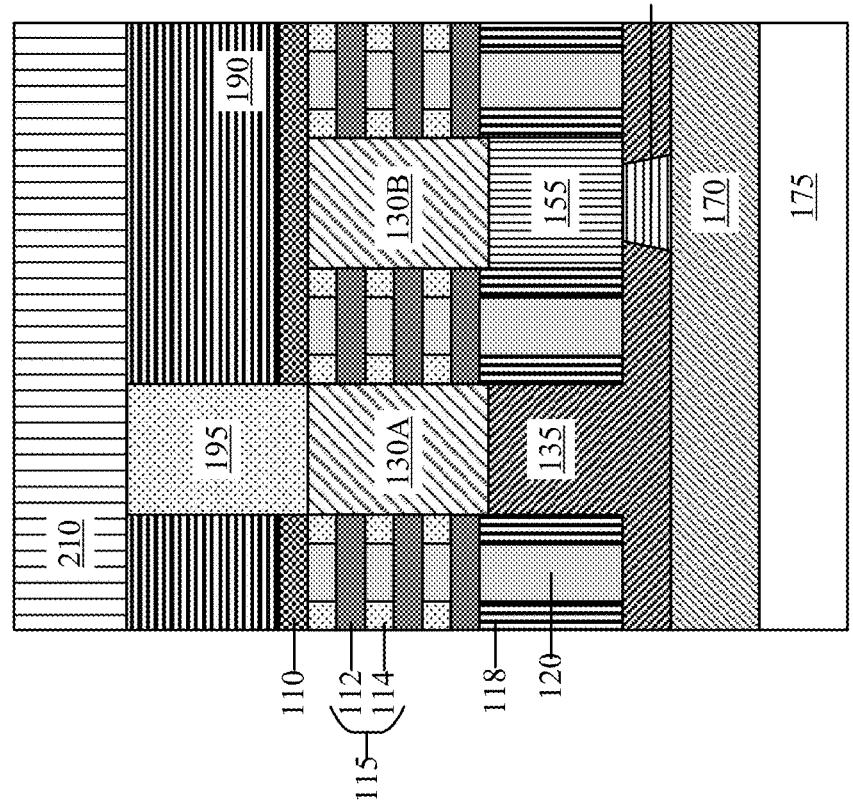
FIG. 15 illustrates a cross section X2 of the nano stack after formation of a plurality of backside metal lines, in accordance with the embodiment of the present invention.
Figure 16:
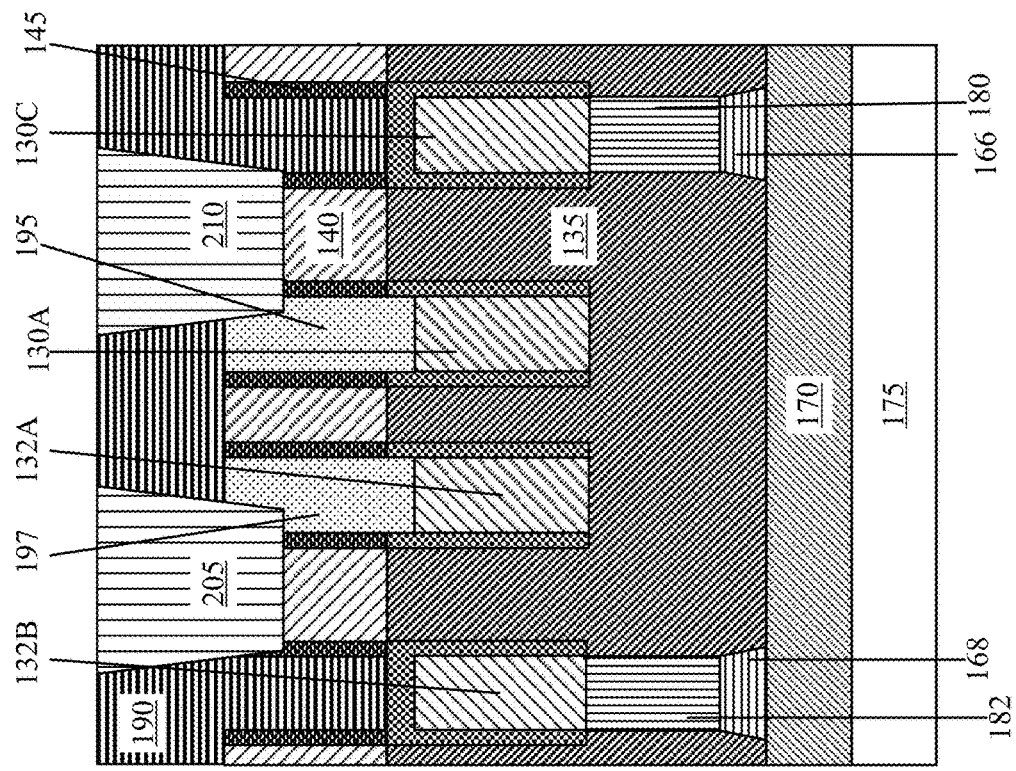
FIG. 16 illustrates a cross section Y1 of the source/drain region after formation of a plurality of backside metal lines, in accordance with the embodiment of the present invention.
Figure 17:
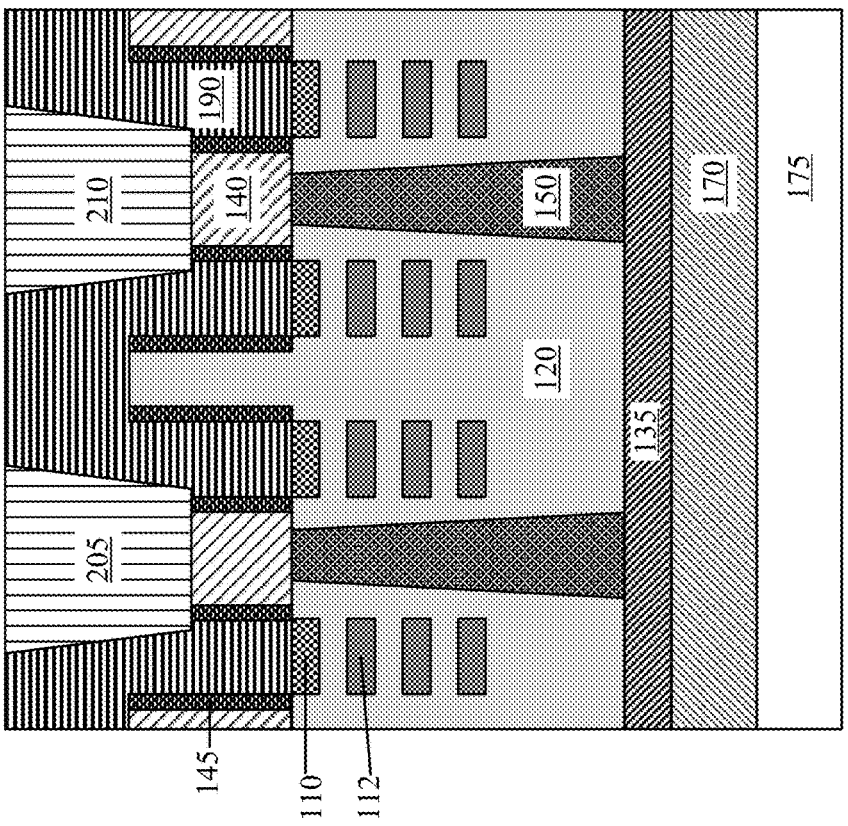
FIG. 17 illustrates a cross section Y2 of the source/drain region after formation of a plurality of backside metal lines, in accordance with the embodiment of the present invention.

FIGS. 14, 15, 16, and 17 illustrate the processing stage after formation of a plurality of backside metal lines 205 and 210. As illustrated in FIG. 14 a second backside metal line 210 is formed on top of the backside interlayer dielectric layer 190 and on top of the first backside contact shaft 195. FIG. 14 illustrates that additional backside interlayer dielectric layer 190 material is formed on top of the shallow trench isolation layer 140 and on top of the backside surface of the gate protrusion 120P. Trenches (not shown) are formed in the backside interlayer dielectric layer 190, the shallow trench isolation layer 140, and the dielectric liner 145. The trenches are filled in with a conductive material to form the first backside metal line 205 and the second backside metal line 210. FIG. 17 illustrates that the first backside metal line 205 is in contact with the second backside contact shaft 197. The second backside contact shaft 197 is in contact with a sidewall and bottom wall of the first backside metal line 205. The bottom surface of the first backside metal line 205 is in contact with the shallow trench isolation layer 140, the dielectric liner 145, and the second backside contact shaft 197. The second backside metal line 210 is in contact with the first backside contact shaft 195. The first backside contact shaft 195 is in contact with a sidewall and bottom wall of the second backside metal line 210. The bottom surface of the second backside metal line 210 is in contact with the shallow trench isolation layer 140, the dielectric liner 145, and the first backside contact shaft 195.

Figure 18:
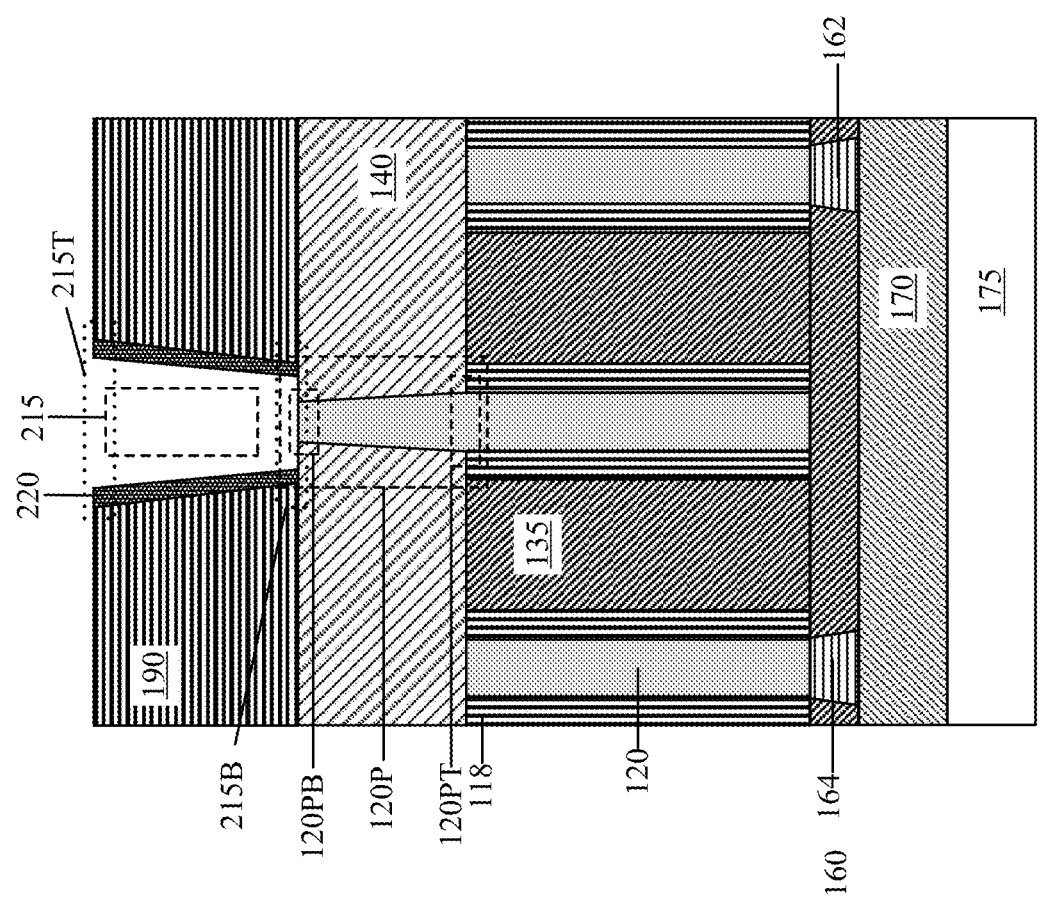
FIG. 18 illustrates a cross section X1 of the nano stack after formation of additional backside interlayer dielectric layer and the formation of a plurality of trenches, in accordance with the embodiment of the present invention.
Figure 19:
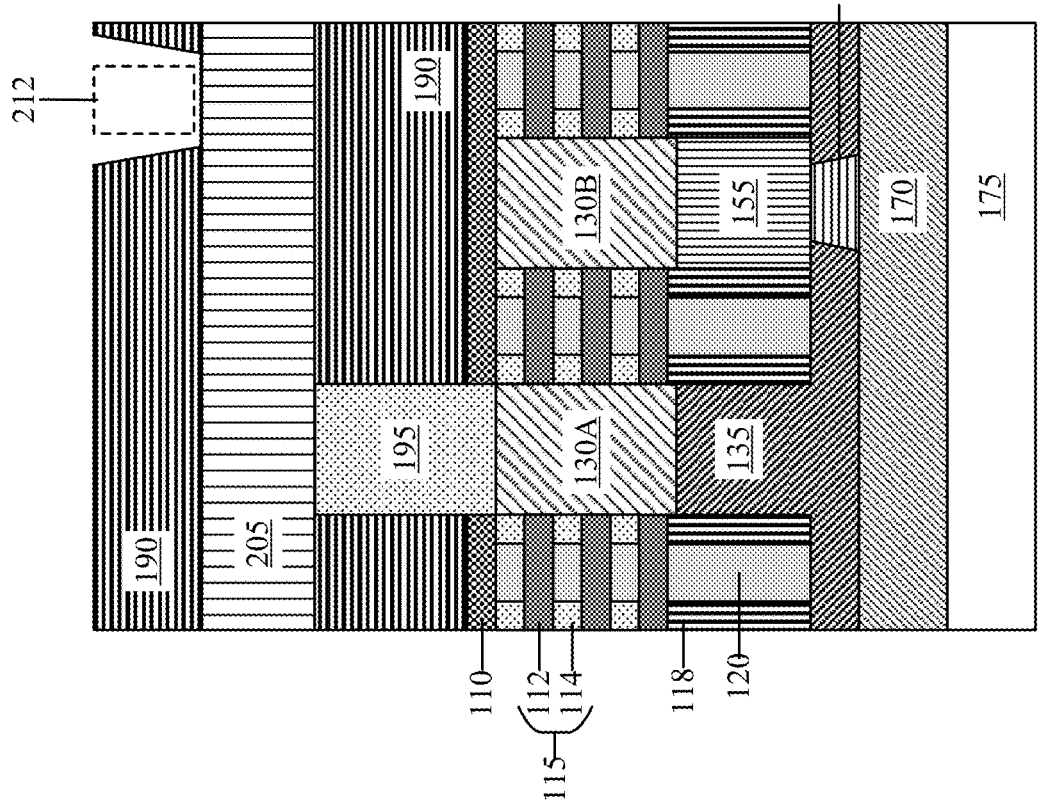
FIG. 19 illustrates a cross section X2 of the nano stack after formation of additional backside interlayer dielectric layer and the formation of a plurality of trenches, in accordance with the embodiment of the present invention.

FIGS. 18, 19, 20, and 21 illustrate the processing stage after formation of additional backside interlayer dielectric layer 190 and the formation of a plurality of trenches. Additional backside interlayer dielectric layer 190 is formed on top of the first backside metal line 205, the second backside metal line 210, and on top of the previously deposited backside interlayer dielectric layer 190. A first trench 212 is formed in the backside interlayer dielectric layer 190 to expose a top surface of the first metal line 205, as illustrated in FIG. 18. A second trench 215 is formed in the backside interlayer dielectric layer 190 to expose the backside surface of the gate protrusion 120P. The bottom section 215B of the second trench 215 is larger than the backside section 120PB of the gate protrusion 120P, as illustrated in FIG. 19. As illustrated in FIG. 20, the bottom section 215B has a width that is substantially equal to the width of the bottom section 120PB of the gate protrusion 120P. The top section 215T is larger than the bottom section 215B of the second trench 215. A second dielectric liner 220 is formed on the exposed surfaces and etch back such that the second dielectric liner 220 is located on the sidewalls of the second trench 215. The second dielectric liner 220 can be the same dielectric material as the dielectric liner 145 or the second dielectric liner 220 can be comprised of a different dielectric material than the dielectric liner 145.

FIGS. 22, 23, 24, and 25 illustrate the processing stage after formation of conductive vias. The first trench 212 and the second trench 215 are filled in with a conductive metal to form the first conductive via 222 and the second conductive via 225. The first conductive via 222 is connected to the first metal line 205 as illustrated by FIG. 22. The second conductive via 225 is connected to the backside surface of the gate protrusion 120P. The sidewalls of the second conductive via 225 are in contact with the second dielectric liner 220 as illustrated by FIGS. 23 and 24. The second conductive via 225 has a bottom section 225B and a top section 225T. The top section 225T is wider than the bottom section 225B. As illustrated in FIG. 23, the bottom section 225B of the second conductive via 225 is wider than the bottom section 120PB of the gate protrusion 120P. FIG. 24 illustrates a different perspective than FIG. 23, where the width of the bottom section 225B of the second conductive via 225 is about the same as the width of the bottom section 120PB of the gate protrusion 120P.

Figures 28, 29:
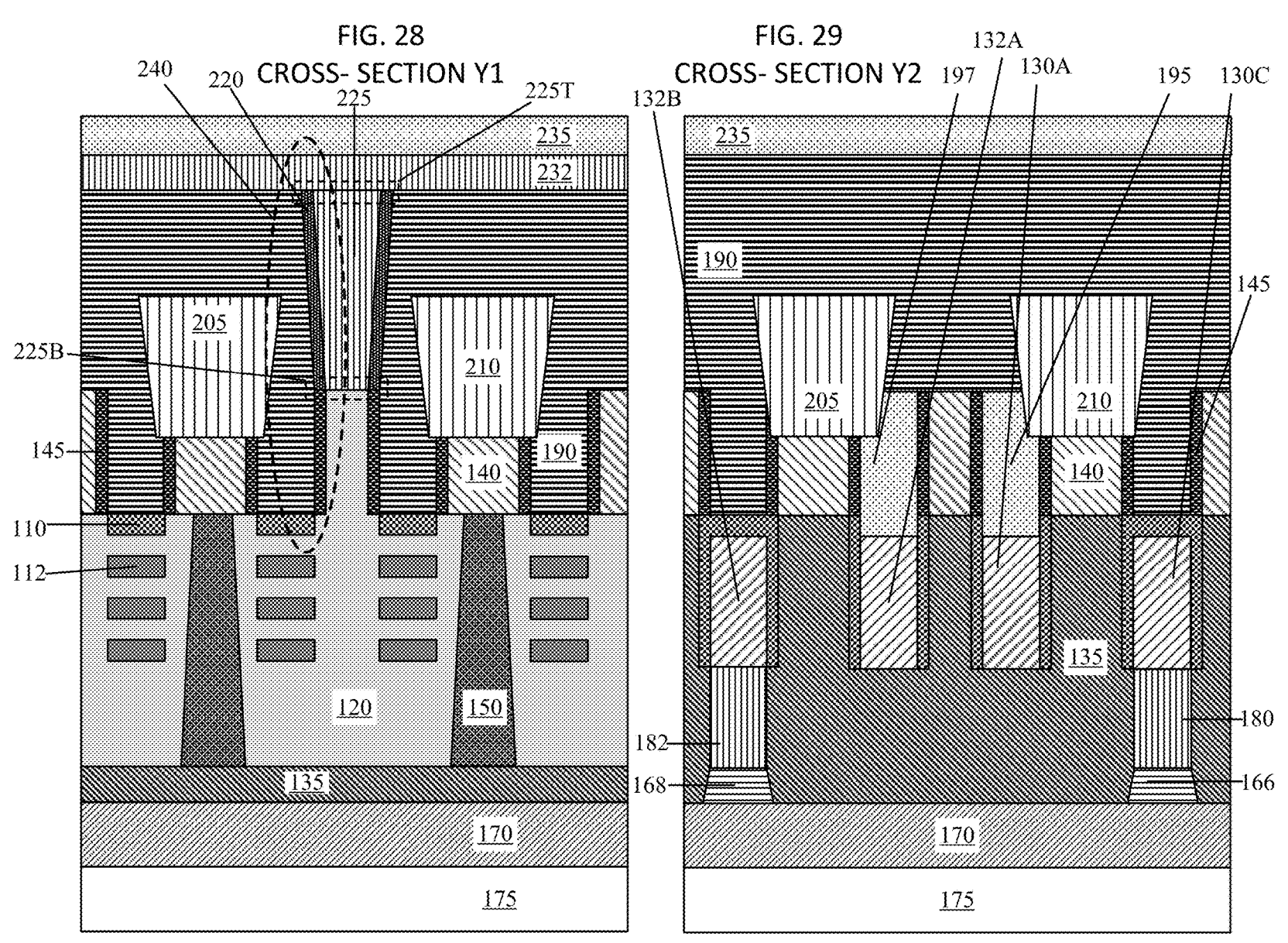

FIGS. 26, 27, 28, and 29 illustrate the processing stage after formation of additional metal lines 230, signal lines 232, and a backside-power-distribution-network 235. Additional, backside interlayer dielectric layer 190 material is formed on top of the first conductive via 222, the second conductive via 225, and on top of the previously deposited backside interlayer dielectric layer 190. A plurality of trenches (not shown) are formed in the backside interlayer dielectric layer 190 and filled with a conductive material to form a plurality of metal lines 230, and a signal line 232. The signal line 232 is located on top of the second conductive via 225. A backside-power-distribution-network (BSPDN) 235 is formed on top of the signal line 232 and the plurality of metal lines 230. Dashed oval 240 emphasizes that a spacer element, i.e., the dielectric liner 145 and the second dielectric liner 220 extend along (e.g., flush against the sidewall or in direct contact with the sidewall) the length of the gate protrusion 120P and the length of the second conductive via 225, as illustrated in FIG. 28. The combined dielectric liner 145 and the second dielectric liner 220 acts as a barrier that prevents the first and second metal lines 205, 210 from shorting with either the gate protrusion 120P or the second conductive via 225.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A structure comprising:
   a plurality of nanosheet transistors each comprising a gate;
   a gate protrusion extends from the gate towards a backside of one of the plurality of electronic devices;
   a first dielectric liner is located flush against a sidewall of the gate protrusion;
   a contact via connected to a backside surface of the gate protrusion; and
   a second dielectric liner located flush against a sidewall of the contact via.

2. The structure of claim 1, wherein the first dielectric liner and the second dielectric liner are comprised of same dielectric material.

3. The structure of claim 1, wherein the first dielectric liner and the second dielectric liner are comprised of different dielectric material.

4. The structure of claim 1, further comprising:
   a shallow trench isolation layer located beneath the gates of the plurality of the nanosheet transistors, wherein the shallow trench isolation layer is flush against the sidewalls of the gate protrusion from a perspective of a first cross-section horizontally across the plurality of nanosheet transistors, wherein the first dielectric liner is flush against the sidewalls of the gate protrusion from a perspective a second cross-section, wherein the second cross-section is perpendicular to the first cross-section.

5. The structure of claim 4, wherein the gate protrusion has a top section that located on a frontside of the gate protrusion and a bottom section that is located on a backside of the gate protrusion.

6. The structure of claim 5, wherein the top section of the gate protrusion has a first width and the bottom section of the gate protrusion has a second width.

7. The structure of claim 6, wherein first width is larger than the second width from the perspective of the first cross section.

8. The structure of claim 7, wherein the contact via has a top section and a bottom section, wherein the bottom section of the contact via is connected to the bottom section of the gate protrusion.

9. The structure of claim 8, wherein the top section of the contact via has a third width and the bottom section of the contact via has a fourth width.

10. The structure of claim 9, wherein third width is larger than the fourth width from the perspective of the first cross section.

11. The structure of claim 10, wherein the fourth width is larger than the second width.

12. A structure comprising:
a plurality of nanosheet transistors each comprising a gate;
a gate protrusion extends from the gate towards a backside of one of the plurality of nanosheet transistors;
a first dielectric liner is located flush against a sidewall of the gate protrusion;
a contact via connected to a backside surface of the gate protrusion;
a second dielectric liner located flush against a sidewall of the contact via;
a shallow trench isolation layer located beneath the gates of the plurality of the nanosheet transistors, wherein the shallow trench isolation layer is flush against the sidewalls of the gate protrusion from a perspective of a first cross-section horizontally across the plurality of nanosheet transistors, wherein the first dielectric liner is flush against the sidewalls of the gate protrusion from a perspective a second cross-section, wherein the second cross-section is perpendicular to the first cross-section, wherein the second dielectric liner is connected to the first dielectric liner from a perspective of the second cross-section, wherein the second dielectric liner and the first dielectric liner form a continuous liner along the sidewalls of the gate protrusion and the contact via from the perspective of the second cross-section.

13. The structure of claim 12, wherein the gate protrusion has a top section that located on a frontside of the gate protrusion and a bottom section that is located on a backside of the gate protrusion.

14. The structure of claim 13, wherein the top section of the gate protrusion has a first width and the bottom section of the gate protrusion has a second width.

15. The structure of claim 14, wherein first width is larger than the second width from the perspective of the first cross section.

16. The structure of claim 15, wherein the contact via has a top section and a bottom section, wherein the bottom section of the contact via is connected to the bottom section of the gate protrusion.

17. The structure of claim 16, wherein the top section of the contact via has a third width and the bottom section of the contact via has a fourth width.

18. The structure of claim 12, wherein third width is larger than the fourth width from the perspective of the first cross section.

19. The microelectronic device of claim 18, wherein the fourth width is larger than the second width.

20. A structure comprising:
a plurality of nanosheet transistors each comprising a gate;
a gate protrusion extends from the gate towards a backside of one of the plurality of nanosheet transistors;
a first dielectric liner is located flush against a sidewall of the gate protrusion;
a contact via connected to a backside surface of the gate protrusion;
a second dielectric liner located flush against a sidewall of the contact via; and
a first backside metal line and a second backside metal line, wherein the gate protrusion and the contact via are located between the first backside metal line and the second backside metal line, wherein the first dielectric liner and the second dielectric liner form a barrier between the gate protrusion and the first backside metal line and the second backside metal line, wherein the first dielectric liner and the second dielectric liner form a barrier between the contact via and the first backside metal line and the second backside metal line.

* * * * *